United States Patent
Deruty

(10) Patent No.: US 10,972,064 B2
(45) Date of Patent: Apr. 6, 2021

(54) AUDIO PROCESSING

(71) Applicant: Sony Corporation, Tokyo (JP)

(72) Inventor: Emmanuel Deruty, Stuttgart (DE)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/531,136

(22) Filed: Aug. 5, 2019

(65) Prior Publication Data

US 2020/0044620 A1 Feb. 6, 2020

(30) Foreign Application Priority Data

Aug. 6, 2018 (EP) .................................. 18187523

(51) Int. Cl.
H03G 5/16 (2006.01)
G10L 25/18 (2013.01)
H04R 3/04 (2006.01)

(52) U.S. Cl.
CPC ............ H03G 5/165 (2013.01); G10L 25/18 (2013.01); H04R 3/04 (2013.01)

(58) Field of Classification Search
CPC ........... H03G 5/165; G10L 25/18; H04R 3/04
USPC ....... 381/103, 98, 56, 58, 102, 101, 99, 104, 381/107; 700/94
See application file for complete search history.

(56) References Cited

U.S. PATENT DOCUMENTS

| 3,229,038 A | 1/1966 | Richter |
| 8,054,993 B1 | 11/2011 | Kreifeldt et al. |
| 8,090,120 B2 | 1/2012 | Seefeldt |
| 2012/0063616 A1 | 3/2012 | Walsh et al. |

(Continued)

FOREIGN PATENT DOCUMENTS

EP 1 538 868 B1 9/2013

OTHER PUBLICATIONS

Marty, E., et al., "Perceptually Uniform Pitch-Loudness Scales for Data Sonification", blog.ericmarty.com, URL: http://blog.ericmarty.com/perceptually-uniform-pitch-loudness-scales-for-data-sonification, 6 Pages total, (Sep. 28, 2015).

(Continued)

*Primary Examiner* — Paul Kim
*Assistant Examiner* — Con P Tran
(74) *Attorney, Agent, or Firm* — Xsensus LLP

(57) ABSTRACT

An audio reproduction method comprises providing equal loudness response data defining a dependency between sound pressure level and frequency, resulting in sounds of equal loudness, including for sounds of a notional negative loudness; generating a required spectral weighting profile from the response data to represent a difference in frequency response between a first audio transducer and a second, different, audio transducer; applying a spectral weighting to an audio signal in dependence upon the derived frequency response; and reproducing the spectrally weighted audio signal using the second audio transducer at an audio reproduction level. In some examples, the generating step comprises: mapping a difference between the first audio transducer and the second audio transducer to a mapped difference in audio level; deriving a frequency response dependent upon a difference between: the response data applicable to the audio reproduction level; and the response data applicable to the audio reproduction level as modified by the mapped difference in audio level.

10 Claims, 6 Drawing Sheets

(56) References Cited

U.S. PATENT DOCUMENTS

| | | | | |
|---|---|---|---|---|
| 2014/0037108 | A1* | 2/2014 | Christoph | H03G 3/20 |
| | | | | 381/107 |
| 2014/0254828 | A1* | 9/2014 | Ray | H03G 5/165 |
| | | | | 381/103 |
| 2014/0321670 | A1 | 10/2014 | Nystrom et al. | |
| 2015/0003649 | A1* | 1/2015 | Horbach | H04R 3/04 |
| | | | | 381/309 |
| 2017/0078793 | A1* | 3/2017 | Alexander | H04R 3/04 |

OTHER PUBLICATIONS

International Organization for Standardization, "Acoustics—Normal Equal-Loudness-Level Contours", ISO 226:2003, 31 Pages total, (Aug. 15, 2003) (with English abstract).

Metzler, B., "Audio Measurement Handbook", Audio Precision, 181 Pages total, (1993).

Fletcher, H., et al., "Loudness, Its Definition, Measurement and Calculation", The Bell System Technical Journal, 54 Pages total, (Oct. 1933).

Robinson, D.W., et al., "A Re-Determination of the Equal-Loudness Relations for Pure Tones", British Journal of Applied Physics, vol. 7, pp. 168-182, (May 1956).

Newell, P.R., et al., "The Yamaha NS10M: Twenty Years a Reference Monitor. Why?", Proceedings of the Institute of Acoustics, vol. 23, No. 8, pp. 29-40, (2001).

Senior, M., "Mixing Secrets for the Home Studio", Focal Press, 353 Pages total, (2011).

Suzuki, Y., et al., "Equal-Loudness-Level Contours for Pure Tones", Journal of the Acoustic Society of America, vol. 116, No. 2, 16 Pages total, (Aug. 2004).

Deruty, E., et al., Human-Made Rock Mixes Feature Tight Relations Between Spectrum and Loudness, Journal of the Audio Engineering Society, vol. 62, No. 10, 12 Pages total, (Oct. 2014).

Fletcher, H., et al., "Loudness, Its Definition, Measurement and Calculation", J. A. S. A., vol. 5, pp. 82-108, (Oct. 1933).

Din Deutsches Institut Fur Normung, "Acoustics—Normal Equal-Loudness-Level Contours", DIN ISO 226:2006-04, 25 Pages total, (Apr. 2006).

Skovenborg, E., et al., "Evaluation of Different Loudness Models with Music and Speech Material", Audio Engineering Society, 34 Pages total, (Oct. 28-31, 2004).

Adam Professional Audio, "SX Series Operation Manual—S3X-V", URL: http://www.adam-audio.com/ en/pro-audio/products/s3x-v/description, 32 Pages total, (Jan. 2015).

Extended European Search Report dated Nov. 21, 2019, issued in corresponding European Patent Application No. 19188783.5, 10 pages.

Eric Jay Alexander, "Unlocking the Mystery of the Greatest Loudspeaker in History: the Yamaha NS10", Pro Audio Clube, May 19, 2016 pp. 1-3.

Choi et al. "An evaluation and comparison of two psychoacoustic loudness models used in low-noise ventilation fan testing", Building and Environment, Pergamon Press, Oxford, GB, vol. 120, May 10, 2017,12 pages.

Korff, C., "Spotlight: Secondary Monitors", Sound on Sound, 4 Pages, (May 2014).

Walker, M., "Mixing on Headphones", Sound on Sound, 8 Pages, (Jan. 2007).

Ward, P., "Monitors Versus Hi-fi Speakers for Project Studio Monitoring", Sound on Sound, 6 Pages (Jun. 2002).

* cited by examiner

AUDIO PROCESSING

CROSS-REFERENCE TO RELATED APPLICATION

The present application claims priority to European Patent Application 18187523.8 filed by the European Patent Office on Aug. 6, 2018, the entire contents of which being incorporated herein by reference.

BACKGROUND

This disclosure relates to audio processing.

In the course of, for example, music mixing, it is known for mixing technicians to listen to the work in progress on high-grade and reference monitors alternatively. While high-grade monitor loudspeakers can provide accuracy, transparency and generally faithful restitution of all frequencies, reference monitors are used to evaluate how the mixed music will sound when reproduced by real-world, consumer-grade loudspeakers. In this context, it is noted that (apart from specific signal processing applied deliberately in some loudspeaker or other systems), modern audio equipment can be considered as "transparent" before the loudspeakers, which is to say that even relatively low-end equipment can reproduce and amplify audio signals with a generally flat frequency response; it is at the stage of mechanical reproduction by audio transducers that significant differences in spectral response can be introduced.

The human ear is not equally sensitive to all frequencies, which has prompted scientists to look for the physical level that a notional human ear requires to hear all frequencies at the same loudness. This results in the generation of so-called equal-loudness contours (ELCs) such as the so-called Fletcher-Munson curves or the ISO226-2003 standard curves. The Fletcher-Munson curves are somewhat older than the ISO curves (1933 vs 2003), and so are considered less relevant to the present description than the ISO226-2003 curves.

An example representation of the ISO226-2003 curves is provided by FIG. 1 of the accompanying drawings. Each contour represents the physical level required for the ear to hear a pure sine tone at the same loudness, this level being measured in phon. By convention, physical and perceptual levels have the same value in the case of a 1000 Hz pure tone. In other words, therefore, the level of a given sound in phon is the dB (decibel or log scale) SPL (sound pressure level) of a sound at a frequency of 1 kHz that sounds just as loud as the given sound. A level of 0 phon has been adopted by convention to represent the limit of human perception.

SUMMARY

The present disclosure provides an audio reproduction method comprising:

providing equal loudness response data defining a dependency between sound pressure level and frequency, resulting in sounds of equal loudness, including for sounds of a notional negative loudness;

generating a required spectral weighting profile from the response data to represent a difference in frequency response between a first audio transducer and a second, different, audio transducer;

applying a spectral weighting to an audio signal in dependence upon the derived frequency response; and reproducing the spectrally weighted audio signal using the second audio transducer at an audio reproduction level.

The present disclosure recognises the empirical features that monitor grade and monitoring level (audio reproduction level) can have a similar effect on the spectrum perceived by the listener. For instance, lowering the audio reproduction level while using high-end loudspeakers and switching to lower grade monitors such as reference monitors may modify the perceived frequency response in a comparable manner.

A factor behind this phenomenon lies in the fact that smaller monitors generally provide less bass frequencies than larger, higher-grade monitors. The human ear's capability to transmit bass frequencies decreases along with audio reproduction level quicker than it does with other frequencies. As discussed below, the ear's relative loss of low frequency perception that goes along with level decrease is similar to the relative loss of bass frequencies that results from the use of smaller monitors. More generally, the frequency response variations corresponding to the switch between different grades of monitors are roughly comparable to the perceived frequency response variations corresponding to audio reproduction level changes. As a result, audio reproduction level and monitor grade can be merged into a single axis, which would range from low-level playback on control monitors to high-level playback on high-grade monitors. On a practical note, the present disclosure suggests that home-studio owners with only one pair of monitors may in principle simulate other monitors of a different grade by simply using the monitoring level (audio reproduction level) knob.

Note that although the lowering of the audio reproduction level has an effect on the perceived frequency response, this does not require that the listener listens to quieter audio in order to provide this simulation. Embodiments to be discussed below can provide for the simulation of the altered frequency response while still providing for the reproduction of the audio signal at the original audio reproduction level.

Further respective aspects and features of the present disclosure are defined in the appended claims.

It is to be understood that both the foregoing general description and the following detailed description are exemplary, but are not restrictive, of the present technology.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, in which.

DESCRIPTION OF THE PREFERRED EMBODIMENTS

Figure 1:
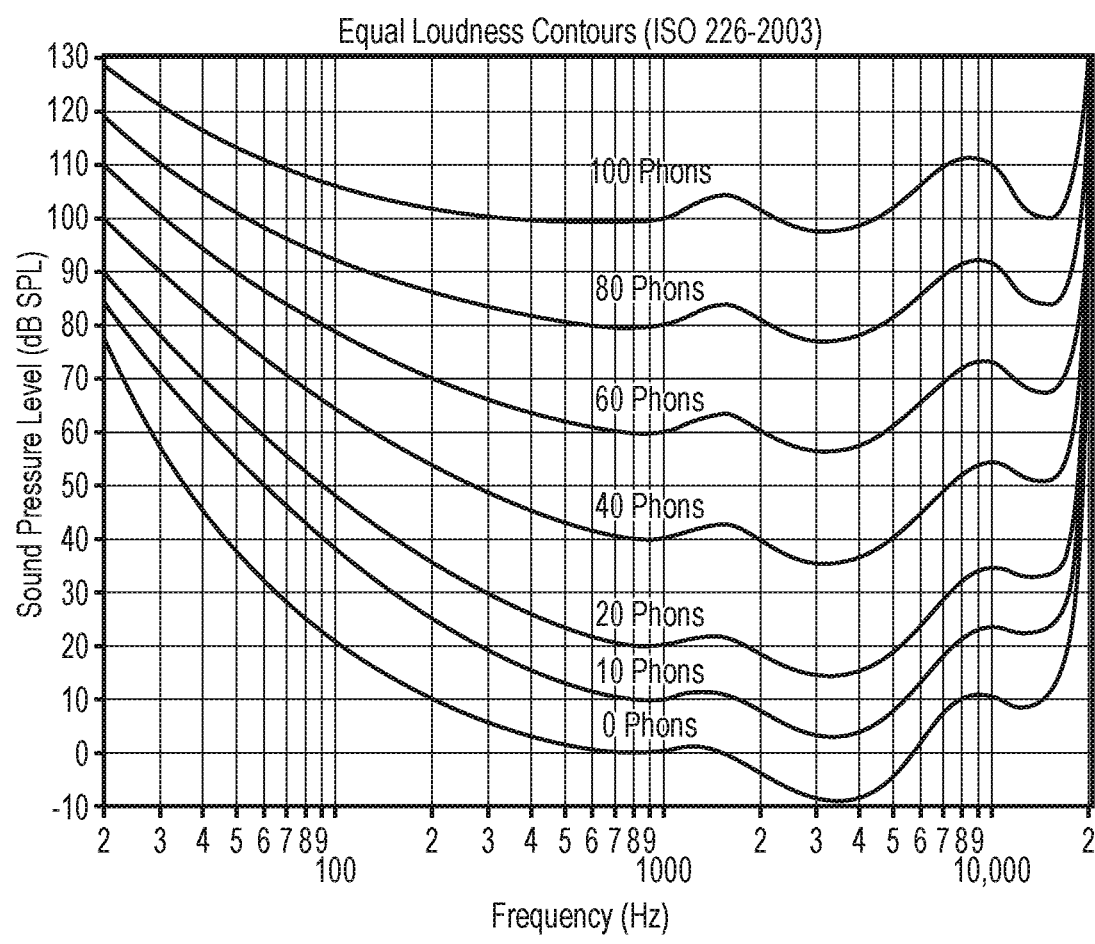
FIG. 1 schematically provides an example representation of a set of ISO226-2003 curves.

First, a discussion of the technical background to the present embodiments will be provided.

As background, three grades of example audio transducer (referred to here using the term "monitor") will be discussed, as shown in the table below. It will be appreciated however that these are purely examples of different audio transducer grades.

| Audio Transducer Grade | Properties | Illustrative Examples |
|---|---|---|
| Main Monitor | These are typically €10000-20000 professional products, which usually come with a dedicated DSP (digital signal processing) unit that enables the user to get a custom frequency response in relation to the system's physical environment. In the present description, it is assumed that the DSP systems are adjusted so that the transducers, taking into account the DSP properties, feature a flat frequency response. | Genelec 1035B Augspurger active DSP main monitor systems Adam S7A |
| Midfield Monitor | These are high quality loudspeakers, though not generally of the same quality or expense as reference monitors; the term "midfield" refers to design characteristics leading to a preferred use in a mid-sized physical environment (a large listening room rather than, for example, a theatre or auditorium) and a listening distance of at least a few metres | Adam S3XV Dynaudio BM5 KRK K-Rok Genelec 1032B Neumann O-410. |
| Control or Reference Monitor | These are typically much cheaper than, and not such high quality as, midfield monitors. They are generally designed to reproduce faithfully (without enhancement by DSP or equalisation circuitry) how the audio signal would sound on a good lower-grade system. An aim is that if a mixing technician mixes a music track so that it sounds good on control or reference monitors, the music track will be assumed to sound good in many generic consumer listening environments | Auratone 5C Avantone Active MixCubes Equator D5 Genelec 6010B Yamaha NS10M |

As discussed above, while a mixing technician might generate a mix of a music track using main monitors, typically the technician might then listen to the mixed track on control or reference monitors to check how it might sound in a real-world environment. Indeed, it has been noted that some mixing technicians listen to newly mixed tracks in their cars to hear how the track might sound to a typical listener.

The present embodiments relate to audio processing techniques to allow the audio performance of one grade (in the sense discussed above with reference to the example table) of audio transducer to be reproduced by another grade of audio transducer.

As mentioned above, FIG. 1 schematically represents an example set of equal loudness contours corresponding to ISO226:2003. In each instance (each curve or contour) a reference point is at 1000 Hz. Here, the SPL is equal to the number of phons represented by the contour (so for example, the "100 phons" curve passes through 100 dB SPL at 1000 Hz). At other points on the curve, the curve indicates the SPL required to hear that tone at the same perceived loudness as the 1000 Hz tone. For example, referring to the 100 phon curve, at a frequency of about 1500 Hz, the curve rises above the 100 dB SPL level, indicating that a greater SPL is required for the ear to perceive a 1500 Hz tone at the same loudness as a 1000 Hz tone at 100 dB SPL. Conversely, at a frequency of about 3 kHz, the 100 phon curve drops below the 100 dB level, indicating that an SPL of less than 100 dB is needed for a 3 kHz tone to sound as loud as a 1000 Hz tone at 100 dB SPL.

In general terms, the mapping of SPL to frequency is different for the different contours, representing a non-linear response by the human ear and psycho-auditory system.

It will be appreciated that the equal loudness function can be represented by discrete contours at 20 phon intervals as shown in FIG. 1, or by a larger number of more closely-spaced contours, or by an approximation by a continuous function in three-dimensional space. In the case of a set of discrete contours, outputs relating to intermediate phon values can be obtained by interpolation between contours. Therefore, this provides an example of the response data comprising a set of frequency responses, one for each of a set of discrete audio levels, and an example of a process of interpolating a frequency response from one or more of the set of frequency responses.

Weighting and Equalisation

These curves can be used for weighting or equalisation, or in other words the operation according to which a gain is applied to the level of each frequency band of an audio signal according to a set of ELCs, so that further operations on the audio signal take into account the sensitivity of the ear.

As ELCs are dependent on loudness, so is weighting. For instance, the widespread so-called "A-weighting" curve used in some equalisers is based upon an inverse of the 30-phon (or 30 dB-SPL) equal-loudness curve of Fletcher-Munson; the A-weighting curve therefore attempts to model the sensitivity of the human ear at low levels.

Arrangements will be discussed below in which combinations of the ELC curves can be used to equalise or weight the audio signal, for example in order to simulate the reproduction of that audio signal by a different grade or class of audio transducer.

Example 1—Switching from Midfield to Control (Reference) Monitors

Here, it has been found empirically that switching from midfield to reference monitors can be compared in terms of perceived spectral balance to an audio reproduction level decrease of 40-50 dB.

As background, the five example midfield monitors and five example reference monitors listed in the table above were compared in terms of frequency response.

Figure 2A:
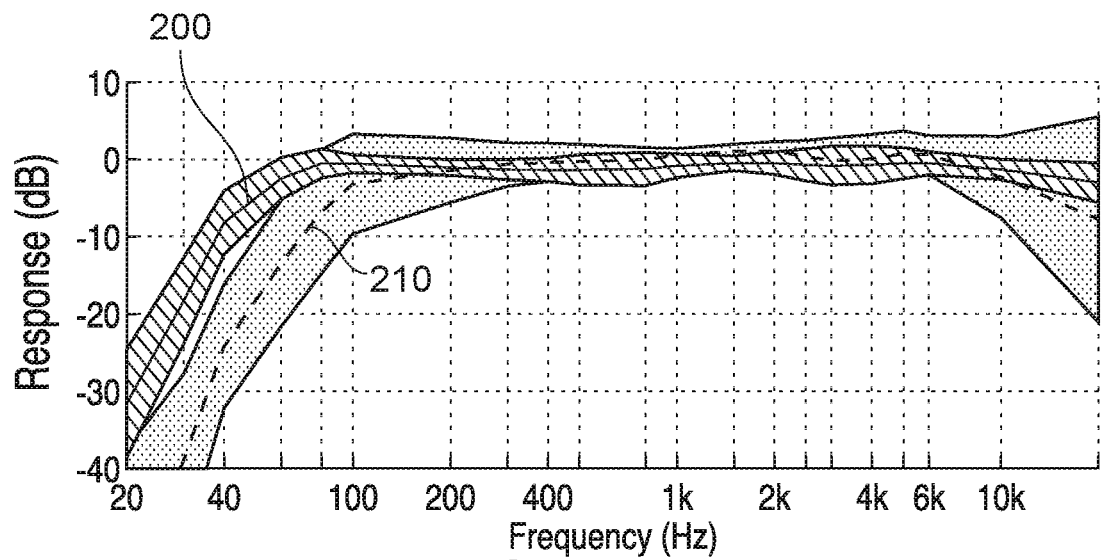
FIGS. 2a to 2c and 3a to 3c schematically represent the mapping of ELC curve differences to transducer grade differences.

FIG. 2a schematically illustrates a median frequency response for both groups of speakers, with a solid line 200 representing midfield monitors and a broken line 210 representing control monitors.

Figure 2B:
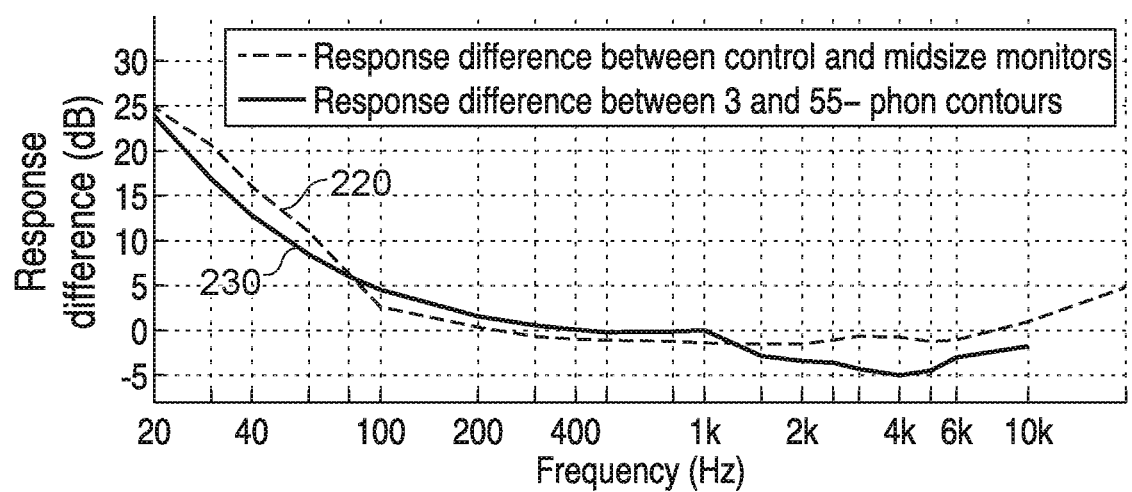

FIG. 2b, compares the difference 220 between these median frequency responses to the difference 230 between the ISO226:2003 equal loudness contours at example levels of 3 and 55 phon, an example contour difference empirically found to be close to the difference introduced by the monitor switch.

Figure 2C:
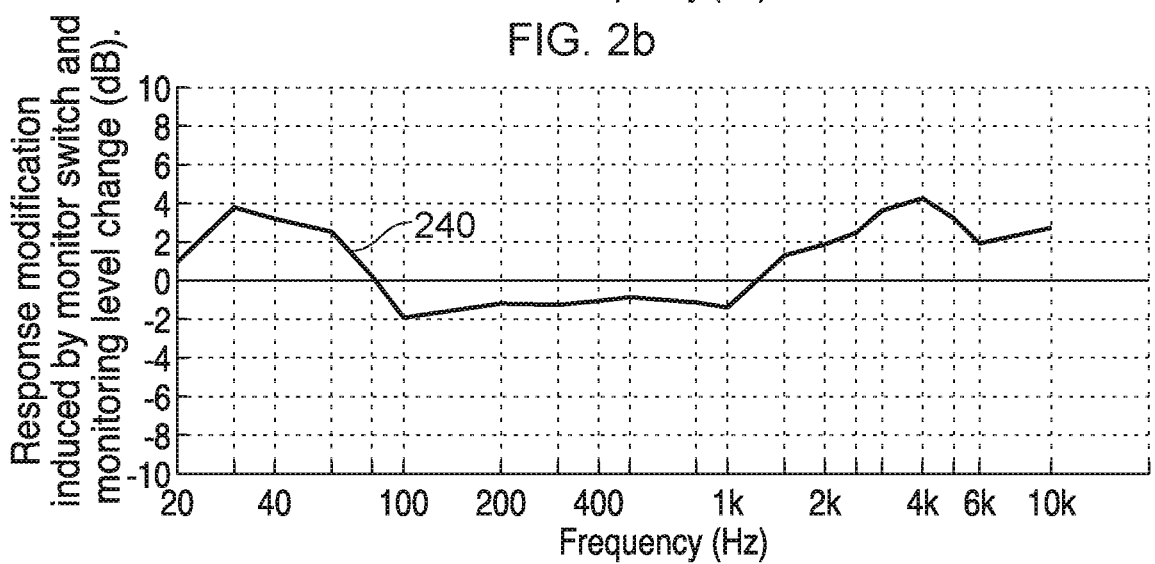

As illustrated by a difference curve in in FIG. 2c, these two differences are within 4 dB of each other.

In other words, FIGS. 2a-2c schematically demonstrate that switching monitor grade and changing the audio reproduction level can lead to similar results in terms of perceived spectral balance.

In the context of ISO226:2003, the influence of various possible changes of audio reproduction level on perceived spectral balance has been evaluated and compared to the influence of a monitor switch. It has been found empirically that for each initial audio reproduction level value, there exists a particular target audio reproduction level value for which the induced perceived frequency response change is the closest to the perceived frequency response change induced by the monitor switch. For low initial audio reproduction levels (0 to 10 phon), the difference between the two audio reproduction levels is approximately 50 dB. For higher initial audio reproduction levels, the difference between the two audio reproduction levels is approximately 40 dB.

Example 2—Switching from Main to Midfield Monitors

Here, once again, it has been found by empirical analysis that switching from high-end main monitors to midfield monitors can be compared in terms of perceived spectral balance to an audio reproduction level decrease of 30-45 dB.

Figure 3A:
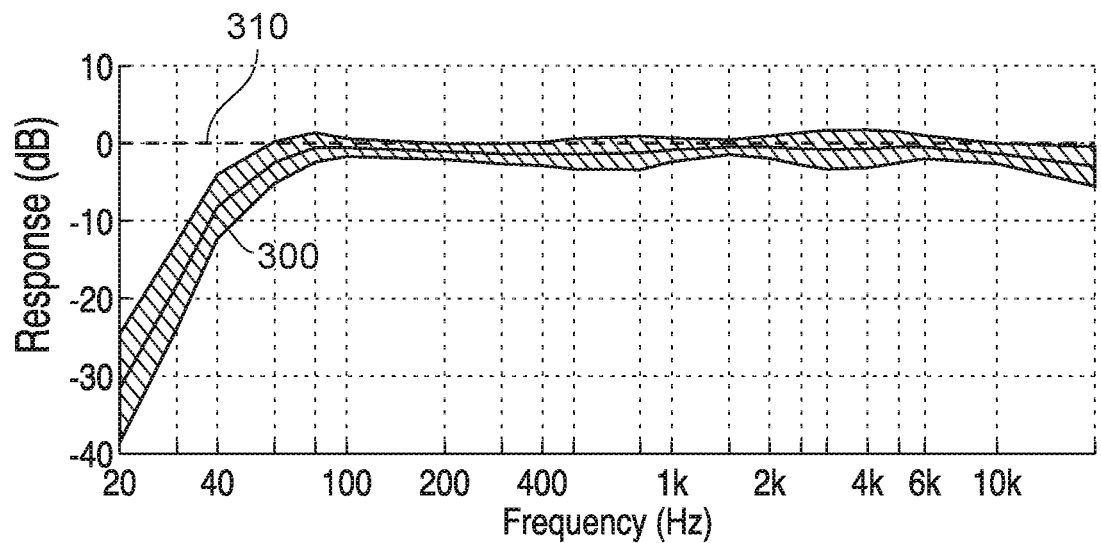

FIG. 3a schematically illustrates a median frequency response for both groups of speakers. Frequency responses for midfield monitors (represented by a curve 300) are the same as in FIG. 2a, and frequency responses for high-end monitors are flat (as represented by a curve 310).

Figure 3B:
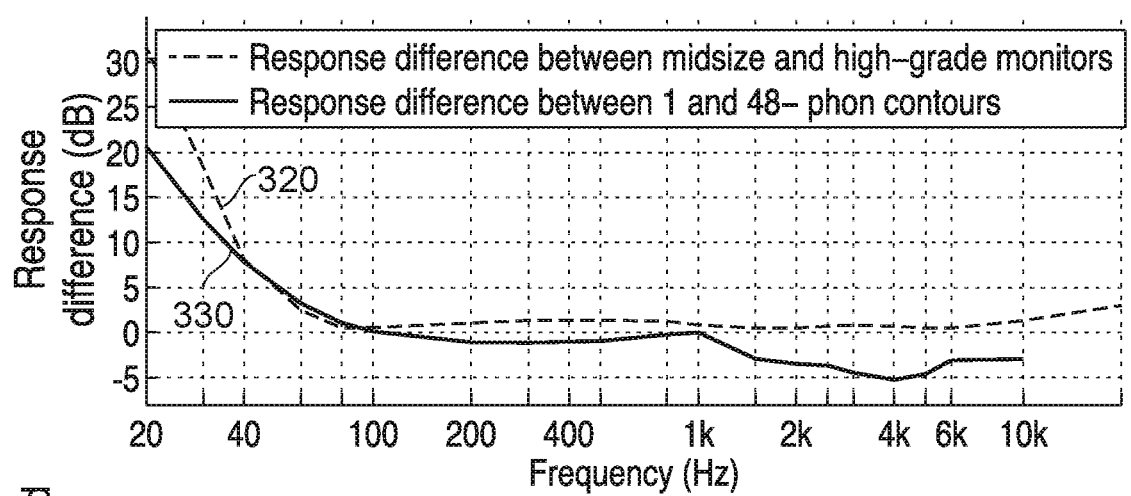

FIG. 3b compares the difference 320 between these median frequency responses to the difference 330 between the ISO226:2003 equal loudness contours at 1 and 48 phon—the contour difference found empirically to be closest to the frequency variation induced by the monitor switch.

Figure 3C:
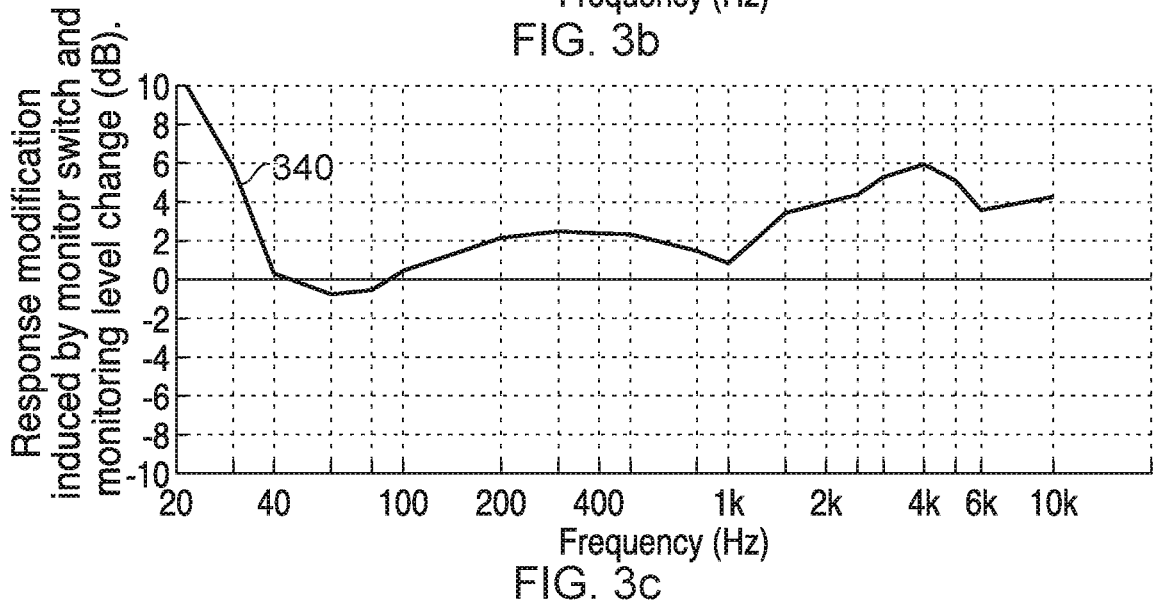

As further illustrated by a difference curve 340 (representing the difference between the curves 320 and 330) in FIG. 3c, switching from main to midfield monitors is similar to lowering the audio reproduction level from 48 to 1 phon, with two significant differences. First, high-grade main monitors are able to provide more deep bass frequencies (20-40 Hz) than the closest change of audio reproduction level. Then, switching from main to midsize monitors provides a spectrum with relatively less medium-bass frequencies (50-200 Hz). In other words, the resulting approximation provides a spectrum that is richer in high-medium frequencies (2-4 KHz).

As discussed above, by considering empirically the influence of various possible changes of audio reproduction level on the perceived spectral balance, and comparing them to the influence of monitor switch, it is found that for low initial audio reproduction levels, the audio reproduction level change closest to the monitor switch is around 40-50 dB. For higher initial audio reproduction levels, the audio reproduction level change closest to the monitor switch is around 30 dB.

Example Uses of these Results in Audio Processing

The discussion above has shown that the difference of frequency response stemming from the variation of loudspeaker quality can be similar to the difference of frequency response stemming from different sound pressure levels. In other words, lowering the quality of loudspeakers modifies the frequency response the same way lowering audio reproduction levels does.

As discussed above, main monitors are high-quality loudspeakers that can be considered as audibly transparent. When content is played back at a loudness of 40 phon on main monitors, the resulting weighting performed by the ear corresponds to a 40-phon ELC. But when the same content is played on midfield monitors (medium quality loudspeakers), then the spectral contribution of the monitors relative to that of the main monitors corresponds to the difference in ELC representing a reduction of 30 phon. The combined weighting resulting from the monitors and the ear is therefore 40 −30=10 phon.

The spectral performance of the midfield monitors for a loudness of 40 phon can therefore be simulated by:

(a) spectral modification or weighting of the audio signal in dependence upon a difference between the 40 phon and the 10 phon ELC; and (b) reproduction at a level of 10 phon by the main monitor loudspeakers When the same content is played on control monitors (low-quality loudspeakers, having a spectral effect equivalent to a change in ELC of −50 phon as discussed above), then the combined weighting resulting from the monitors and the ear is 40−50=minus 10 phon, a negative loudness value. No physically measured ELCs exist for this loudness value.

There is therefore a need for negative loudness ELCs. With the use of negative loudness ELCs, modelling the frequency response of both the playback system and the listener's auditory system using only ELCs can be performed in the general case.

Generation of Negative Loudness ELCs

Negative loudness ELCs can be projected or extrapolated from the behaviour of positive loudness ELCs. ELC data for each frequency is isolated. Shape-preserving piecewise cubic interpolation (used as a technique in the sense of extrapolation of data points) is applied to each frequency-specific curve as to project data corresponding to negative loudness values. The result on ISO226-2003 ELCs is illustrated by continuous or closely sampled values in FIG. 4, where a shaded portion 400 represents an extrapolation of the physically measurable (above-zero level) portion 410. Note that embodiments of the disclosure are not necessarily limited to the use of ISO226-2003 ELCs. A corresponding process can be applied to other ELC sets such as (for example) so-called Fletcher-Munson or so-called Robinson-Dadson data sets.

Therefore, it has been shown that monitor grade and audio reproduction level can have a similar effect on the spectrum perceived by the listener. For instance, lowering the audio reproduction level while using high-end loudspeakers and switching to lower grade monitors such as reference monitors may modify the perceived frequency response in a comparable manner.

More generally, it has been found that the frequency response variations corresponding to the switch between different grades of monitors are roughly comparable to the perceived frequency response variations corresponding to audio reproduction level changes. As a result, audio reproduction level and monitor grade can be considered schematically as being capable of being merged into a single axis 420 (FIG. 4), which would range from low-level playback on control monitors to high-level playback on high-grade monitors. The annotation "−<-Quality->+" on the axis 420 refers to the concept of "using these ELCs simulates a better quality or grade".

The existence of this notional single axis can be beneficial on many grounds. In some examples to be discussed below, it could be potentially beneficial to the field of automatic mixing. In other examples, it can provide a better understanding of the use of the audio reproduction level in the studio. On a practical note, it suggests that home-studio owners with only one pair of monitors may simulate other monitors of a different grade by simply using an audio reproduction level control on an equaliser. Using such techniques, simulate lower-grade monitors with higher-grade monitors can be achieved (because at least in principle, a higher grade monitor has the capability to faithfully reproduce an audio output affected by artefacts and/or distortions introduced by a lower grade monitor). Simulating higher-grade monitors with lower-grade monitors may, however, be difficult, but examples of the present process make it possible at least to move closer to the response of the higher-grade monitor.

Figure 4:
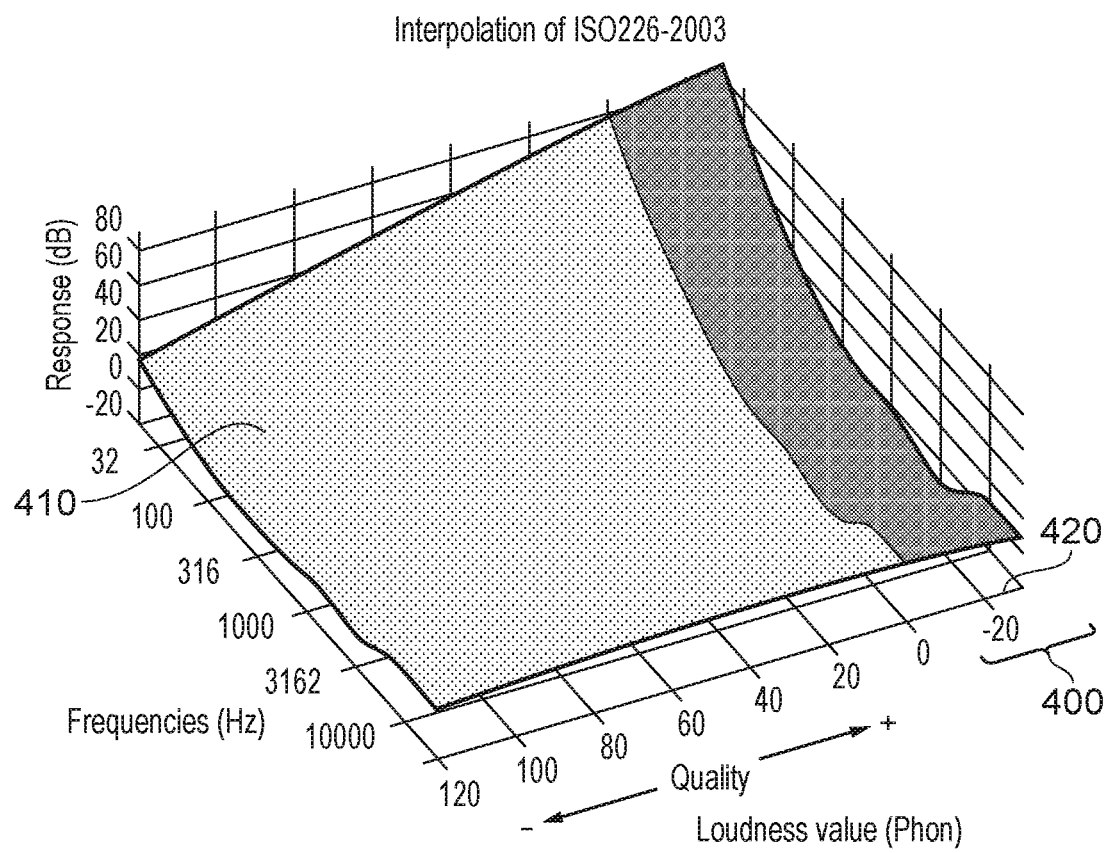
FIG. 4 schematically represents ELC data including for notional negative loudness values.

FIG. 4 therefore provides an example of a set 400, 410 of equal loudness response data defining a dependency between sound pressure level and frequency, resulting in sounds of equal loudness, including for sounds of a notional negative loudness. The positive equal loudness data may be, for example, equal loudness response data defined by ISO 226:2003.

Figure 5:
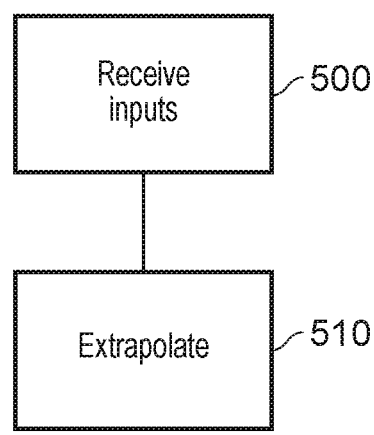
FIGS. 5 and 6 are schematic flowcharts illustrating respective methods.

FIG. 5 is a schematic flowchart illustrating the generation of ELC data extending to negative sound levels.

At a step 500, inputs corresponding to positive-loudness ELC data are provided, such as the data 410 discussed above. At a step 510, equal loudness response data are extrapolated for sounds of a notional negative loudness from equal loudness response data defining a dependency between sound pressure level and frequency, resulting in sounds of equal positive loudness.

Figure 6:
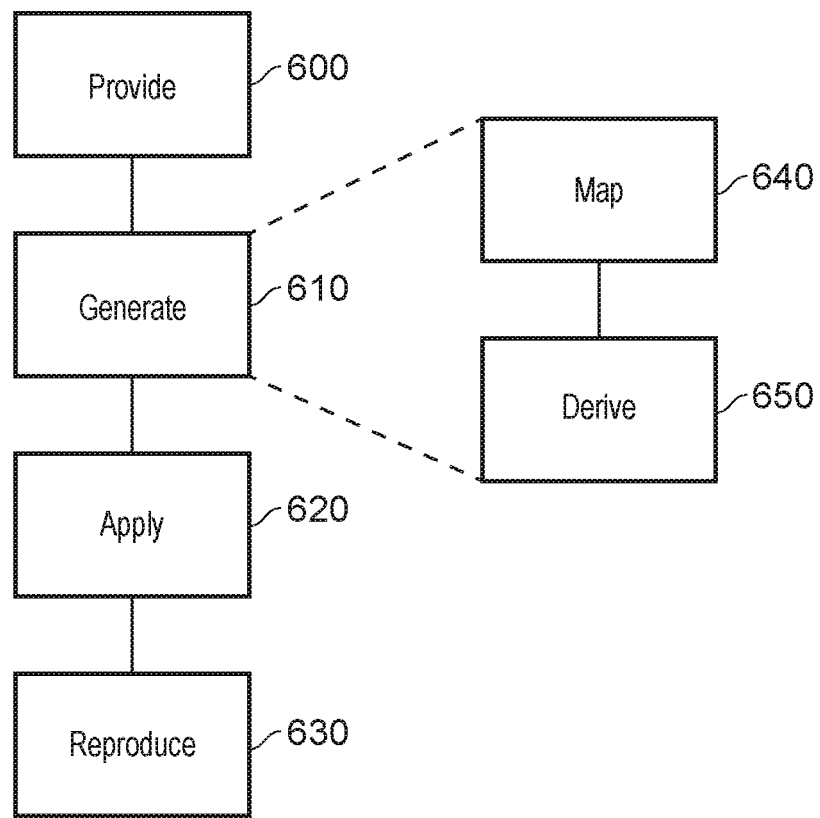

FIG. 6 is a schematic flowchart illustrating an audio reproduction method comprising:

providing (at a step 600) equal loudness response data defining a dependency between sound pressure level and frequency, resulting in sounds of equal loudness; including for sounds of a notional negative loudness;

generating (at a step 610) a required spectral weighting profile from the response data to represent a difference in frequency response between a first audio transducer and a second, different, audio transducer;

applying (at a step 620) a spectral weighting to an audio signal in dependence upon the derived frequency response; and reproducing (at a step 630) the spectrally weighted audio signal using the second audio transducer at an audio reproduction level.

In at least some examples, the generating step comprises:
mapping (at a step 640) a difference between the first audio transducer and the second audio transducer to a mapped difference in audio level; and
deriving (at a step 650) a frequency response dependent upon a difference between:
the response data applicable to the audio reproduction level; and
the response data applicable to the audio reproduction level as modified by the mapped difference in audio level.

Figure 7:
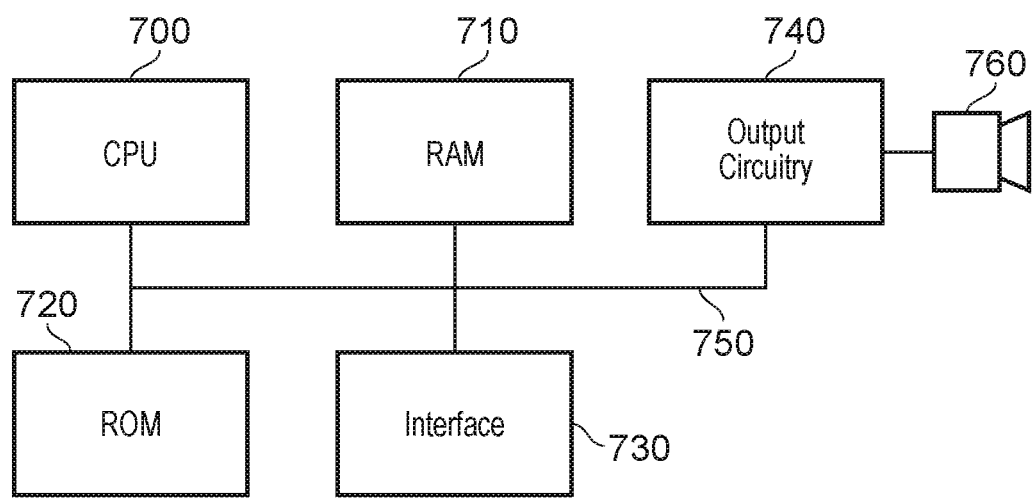
FIGS. 7 and 8 schematically illustrate respective apparatuses.

As an example of audio processing apparatus configured to perform the method defined above, FIG. 7 schematically illustrates an audio processing apparatus comprising a processor (or central processing unit or CPU) 700, random access memory (RAM) 710, read-only memory (ROM) 720 as an example of a machine-readable non-transitory storage medium which stores computer software which, when executed by the apparatus of FIG. 7, causes the apparatus of FIG. 7 to perform the method defined above with reference to FIG. 6 or that of FIG. 5, an interface 730 by which, for example, operating commands are received, and output circuitry 740 to drive an audio transducer 760 for example. These components are linked by a bus structure 750. Other examples of machine-readable non-transitory storage media for use in addition to or in place of the ROM 720 can include flash memory, magnetic disks or optical disks.

Figure 8:
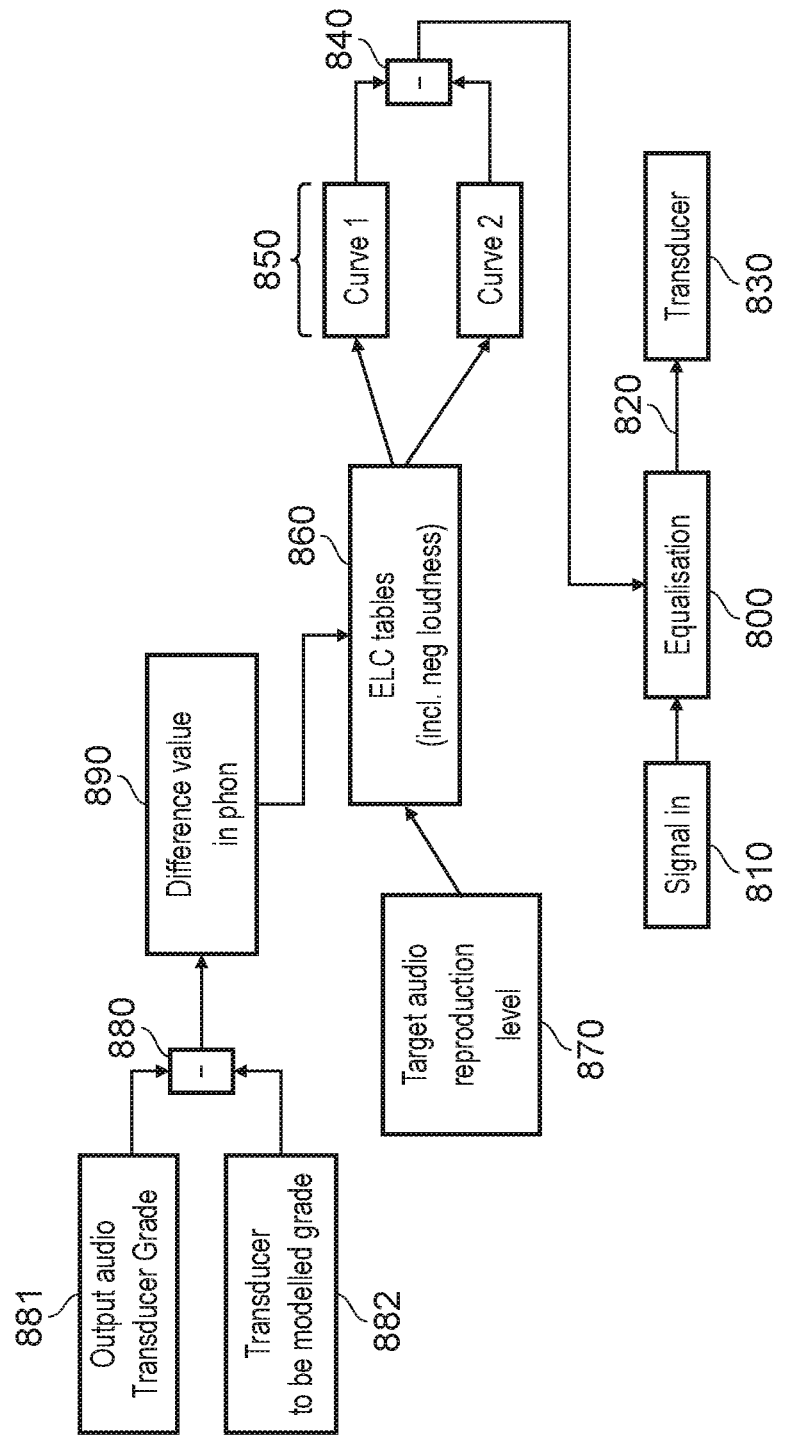

FIG. 8 provides a schematic representation of an audio processing apparatus arranged to perform at least some of the techniques discussed above.

An equalisation module 800 performs equalisation (or in other words, spectrally dependent gain modification) on an input audio signal 810 to generate a spectrally processed audio signal 820 to be reproduced by an output audio transducer 830 such as a loudspeaker. At least a part of the spectrally dependent gain modification is to allow the output audio transducer to model the performance of a second audio transducer. For example, the output audio transducer may be a main monitor and the second audio transducer to be modelled may be a midfield monitor.

The spectrally dependent gain modification is provided by a subtractor 840 which derives the difference between two ELC curves 850 selected from a set of ELC tables 860 (including negative loudness values as discussed above) on the following basis:

(i) One ELC curve of the set 850 is selected according to a target audio reproduction level 870.

(ii) The other ELC curve of the set is selected by mapping a difference (obtained very schematically by a subtractor 880) between a grade 881 of the output audio transducer and a grade 882 of the second transducer to be modelled to a difference value 890 expressed in phon.

Note that the actual responses of the two transducers are not themselves measured and subtracted to provide the spectrally dependent gain modification, but rather the spectrally dependent gain modification is derived from the difference between the two ELC curves as an approximation of the required spectral modification. Indeed, one or both of the transducers may be theoretical or at least of unknown actual physical spectral response, which provides one reason why the present technique is particularly useful (as it allows the modelling to be performed based on an assessment of "grade" rather than requiring a full spectral response for each transducers).

The grades themselves may be provided by an empirical assessment or a set of design parameters for the two transducers and the grades, or at least the difference in grades, are mapped by a predetermined mapping to the difference value 890. The ELC curve is obtained as the ELC curve applicable to the target audio reproduction level, as modified by the difference value in phon 890, for example the target audio reproduction level minus the difference value in phon in the case of a transducer to be modelled which is of a lower grade than the output audio transducer 830.

In other words, a difference in quality or grade (as specified by a user control, for example) is mapped to a loudness difference value 890 in phon, and an ELC curve separated in loudness from that ELC curve selected according to the target audio reproduction level is selected. For example, the difference value 890 may be −40 dB, so that whatever ELC curve is selected for the target audio reproduction level, an ELC curve is selected for a loudness which is lower than that by 40 dB. This may involve a curve applicable to a notional negative loudness, so the ELC curve data 860 includes data for notional negative loudness values.

In alternative example embodiments, each of the two transducers can be mapped to a respective response curve separated in audio level from one another. Such a predetermined mapping between transducer grade and response curve can provide another example of mapping a difference between the first audio transducer and the second audio transducer to a mapped difference in audio level. the two transducers may be defined by their difference in quality, or alternatively it is possible to property of the second transducer, in which case a configuration setting defining a corresponding property or grade of the transducer 830 may be used to provide a comparison. The property may be a classification such as "reference", "midfield", "control", "domestic" or the like.

The ELC data 850 are subtracted by the subtractor 840, in the manner shown in FIGS. 2b and 3b, which is to say that the gain difference between the curves at corresponding frequencies is determined.

The output of the subtractor 840 is then used to apply a spectral gain profile to the input signal 810 by the equalisation module 800 to generate the output signal 820.

When reproduced by the transducer 830, the signal 820 will be perceived to sound like the signal 810 would have sounded if reproduced at the output level 870 by the other (second) transducer.

The mapped difference can be a positive or negative difference. If the transducer in use has a higher quality or grade than the one being modelled, the mapped difference may be a negative difference. If the transducer in use has a higher quality or grade than the one being modelled, the mapped difference may be a negative difference. Therefore this provides an example in which the deriving step depends upon an additive combination of the response data applicable to the audio reproduction level and the mapped difference in audio level, in which the mapped difference in audio level is positive or negative.

This allows various techniques to be used, such as automatic mixing (in which one or more input signals are automatically mixed and processed for output by a target transducer) or the simulation of one transducer using another (for example in a recording studio environment as discussed above). Other possible techniques include the spectral matching to a spectral target profile expressed in the perceptual space, taking into account both speaker range and audio reproduction level.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Similarly, a data signal comprising coded data generated according to the methods discussed above (whether or not embodied on a non-transitory machine-readable medium) is also considered to represent an embodiment of the present disclosure.

It will be apparent that numerous modifications and variations of the present disclosure are possible in light of the above teachings. It is therefore to be understood that within the scope of the appended clauses, the technology may be practised otherwise than as specifically described herein.

Various respective aspects and features will be defined by the following numbered clauses:

1. An audio reproduction method comprising:
    providing equal loudness response data defining a dependency between sound pressure level and frequency, resulting in sounds of equal loudness, including for sounds of a notional negative loudness;
    generating a required spectral weighting profile from the response data to represent a difference in frequency response between a first audio transducer and a second, different, audio transducer;
    applying a spectral weighting to an audio signal in dependence upon generated spectral weighting profile; and
    reproducing the spectrally weighted audio signal using the second audio transducer at an audio reproduction level.
2. A method according to clause 1, in which the generating step comprises:
    mapping a difference between the first audio transducer and the second audio transducer to a mapped difference in audio level;
    deriving a frequency response dependent upon a difference between:
      the response data applicable to the audio reproduction level; and
      the response data applicable to the audio reproduction level as
    modified by the mapped difference in audio level.
3. A method according to clause 2, in which the response data comprises a set of frequency responses, one for each of a set of discrete audio levels.
4. A method according to clause 2 or clause 3, in which the deriving step comprises extrapolating a frequency response from one or more of the set of frequency responses.
5. A method according to any one of clauses 2 to 4, in which the deriving step depends upon an additive combination of the response data applicable to the audio reproduction level and the mapped difference in audio level, in which the mapped difference in audio level is positive or negative.
6. A method according to any one of clauses 2 to 5, in which the mapping step comprises mapping a negative quality difference between the first audio transducer and the second audio transducer to a negative difference in audio level and mapping a positive quality difference between the first audio transducer and the second audio transducer to a positive difference in audio level.
7. Computer software which, when executed by a computer, causes the computer to perform the method of any one of the preceding clauses.
8. A non-transitory machine-readable medium which stores computer software according to clause 6.
9. Audio processing apparatus configured to perform the method of any one of clauses 1 to 6.
10. A set of equal loudness response data defining a dependency between sound pressure level and frequency, resulting in sounds of equal loudness, including for sounds of a notional negative loudness.
11. A method of generating a set of response data according to clause 10, the method comprising:
    extrapolating equal loudness response data for sounds of a notional negative loudness from equal loudness response data defining a dependency between sound pressure level and frequency, resulting in sounds of equal positive loudness.
12. A method according to clause 11, in which the equal loudness response data defining a dependency between sound pressure level and frequency, resulting in sounds of equal positive loudness comprises equal loudness response data defined by ISO 226:2003.

13. Computer software which, when executed by a computer, causes the computer to perform the method of clause 11.

14. A non-transitory machine-readable medium which stores computer software according to clause 13.

15. Use of equal loudness response data defining a dependency between sound pressure level and frequency, resulting in sounds of equal loudness, including for sounds of a notional negative loudness to generate a required spectral weighting profile from the response data to represent a difference in frequency response between a first audio transducer and a second, different, audio transducer, to be applied as a spectral weighting to an audio signal for reproduction by the second audio transducer at an audio reproduction level.

The invention claimed is:

1. An audio reproduction method comprising:
   providing equal loudness response data defining a dependency between sound pressure level and frequency, resulting in sounds of equal loudness, including for sounds of a notional negative loudness;
   generating a spectral weighting profile from the response data including the notional negative loudness to represent a difference in frequency response between a first audio transducer and a second, different, audio transducer, the spectral weighting profile including a spectral gain modification determined at least in part on the notional negative loudness;
   applying the spectral gain modification to an audio signal according to the generated spectral weighting profile; and
   reproducing the spectrally gain modified audio signal using the second audio transducer at an audio reproduction level,
   wherein the generating includes:
     mapping a difference between the first audio transducer and the second audio transducer to a mapped difference in audio level; and
     deriving a frequency response dependent upon a difference between:
       the response data applicable to the audio reproduction level; and
       the response data applicable to the audio reproduction level as modified by the mapped difference in audio level.

2. The audio reproduction method according to claim 1, in which the response data comprises a set of frequency responses, one for each of a set of discrete audio levels.

3. The audio reproduction method according to claim 2, in which the deriving step comprises extrapolating a frequency response from one or more of the set of frequency responses.

4. The audio reproduction method according to claim 1, in which the deriving step depends upon an additive combination of the response data applicable to the audio reproduction level and the mapped difference in audio level, in which the mapped difference in audio level is positive or negative.

5. The audio reproduction method according to claim 1, in which the mapping step comprises mapping a negative quality difference between the first audio transducer and the second audio transducer to a negative difference in audio level and mapping a positive quality difference between the first audio transducer and the second audio transducer to a positive difference in audio level.

6. An apparatus for reproducing audio comprising circuitry configured to:
   provide equal loudness response data defining a dependency between sound pressure level and frequency, resulting in sounds of equal loudness, including for sounds of a notional negative loudness;
   generate a spectral weighting profile from the response data including the notional negative loudness to represent a difference in frequency response between a first audio transducer and a second, different, audio transducer, the spectral weighting profile including a spectral gain modification determined at least in part on the notional negative loudness;
   apply the spectral gain modification to an audio signal according to the generated spectral weighting profile; and
   reproduce the spectrally gain modified audio signal using the second audio transducer at an audio reproduction level,
   wherein the circuitry is further configured to:
     map a difference between the first audio transducer and the second audio transducer to a mapped difference in audio level; and
     derive a frequency response dependent upon a difference between:
       the response data applicable to the audio reproduction level; and
       the response data applicable to the audio reproduction level as modified by the mapped difference in audio level.

7. The apparatus for reproducing audio according to claim 6, in which the response data comprises a set of frequency responses, one for each of a set of discrete audio levels.

8. The apparatus for reproducing audio according to claim 7, wherein the circuitry is further configured to extrapolate a frequency response from one or more of the set of frequency responses.

9. The apparatus for reproducing audio according to claim 6, wherein the circuitry is further configured to derive the frequency response depending upon an additive combination of the response data applicable to the audio reproduction level and the mapped difference in audio level, in which the mapped difference in audio level is positive or negative.

10. The apparatus for reproducing audio according to claim 6, wherein the circuitry is further configured to:
    map a negative quality difference between the first audio transducer and the second audio transducer to a negative difference in audio level; and
    map a positive quality difference between the first audio transducer and the second audio transducer to a positive difference in audio level.

* * * * *